United States Patent [19]
O'Brien

[11] 4,028,555
[45] June 7, 1977

[54] POWER INTERRUPT TEST EQUIPMENT

[75] Inventor: Paul John O'Brien, Northfield, N.J.

[73] Assignee: The United States of America as represented by the Secretary of the Department of Transportation, Washington, D.C.

[22] Filed: Nov. 17, 1975

[21] Appl. No.: 632,214

[52] U.S. Cl. .................................. 361/76; 324/51
[51] Int. Cl.² ........................................ H01H 9/54
[58] Field of Search .................. 307/133; 317/27 R; 324/51, 158 R

[56] References Cited
UNITED STATES PATENTS
2,988,672  6/1961  Kiltz .............................. 307/133 X Primary Examiner—James R. Scott
Assistant Examiner—Morris Ginsburg
Attorney, Agent, or Firm—Herbert E. Farmer; Harold P. Deeley, Jr.

[57] ABSTRACT

A method and means of interrupting multiphase supply current to selected electronic equipment at selectable phase angles, and restoring said supply again at preselected phase angles, in order to test and study equipment performance under controlled interrupt-restore conditions.

8 Claims, 5 Drawing Figures

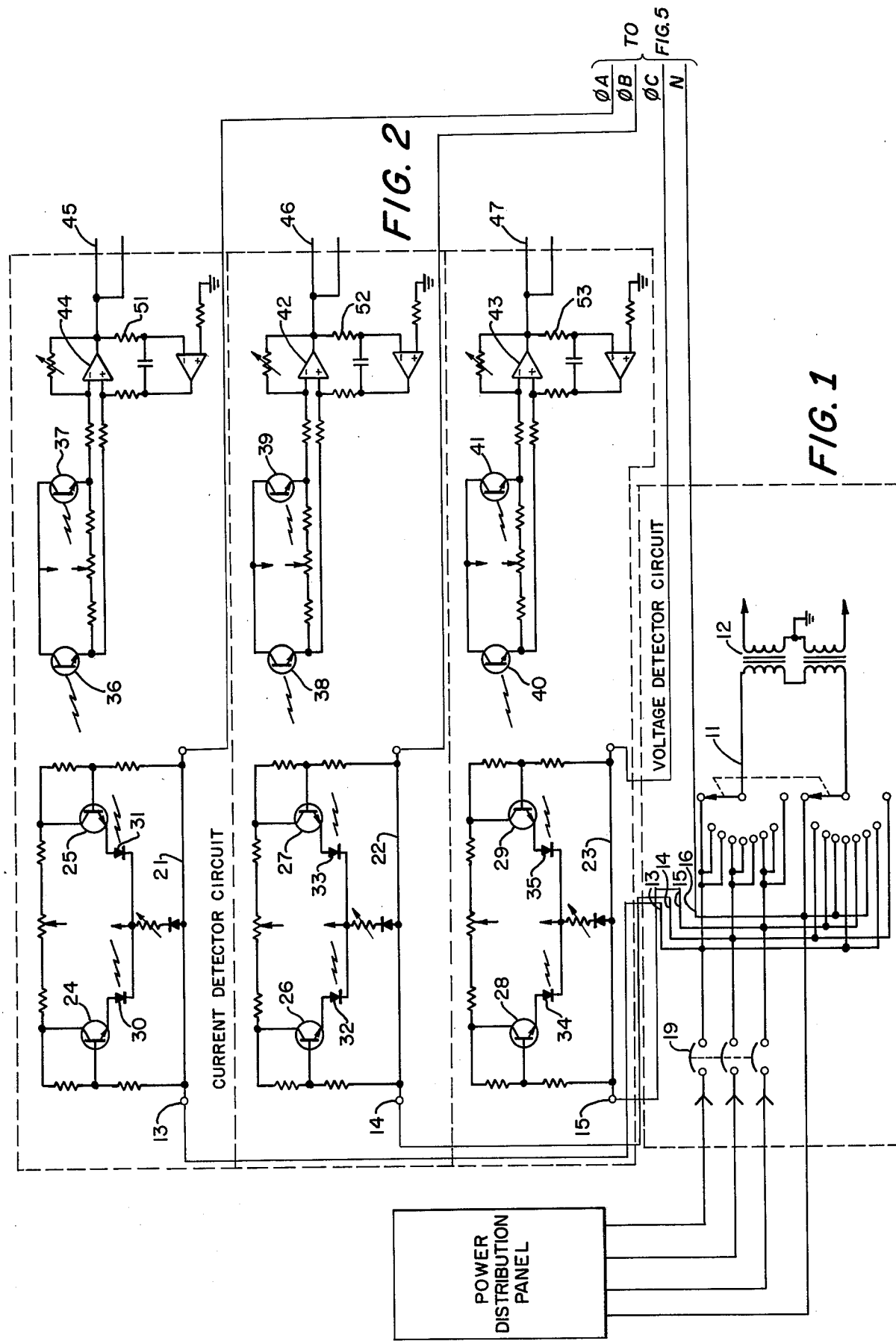

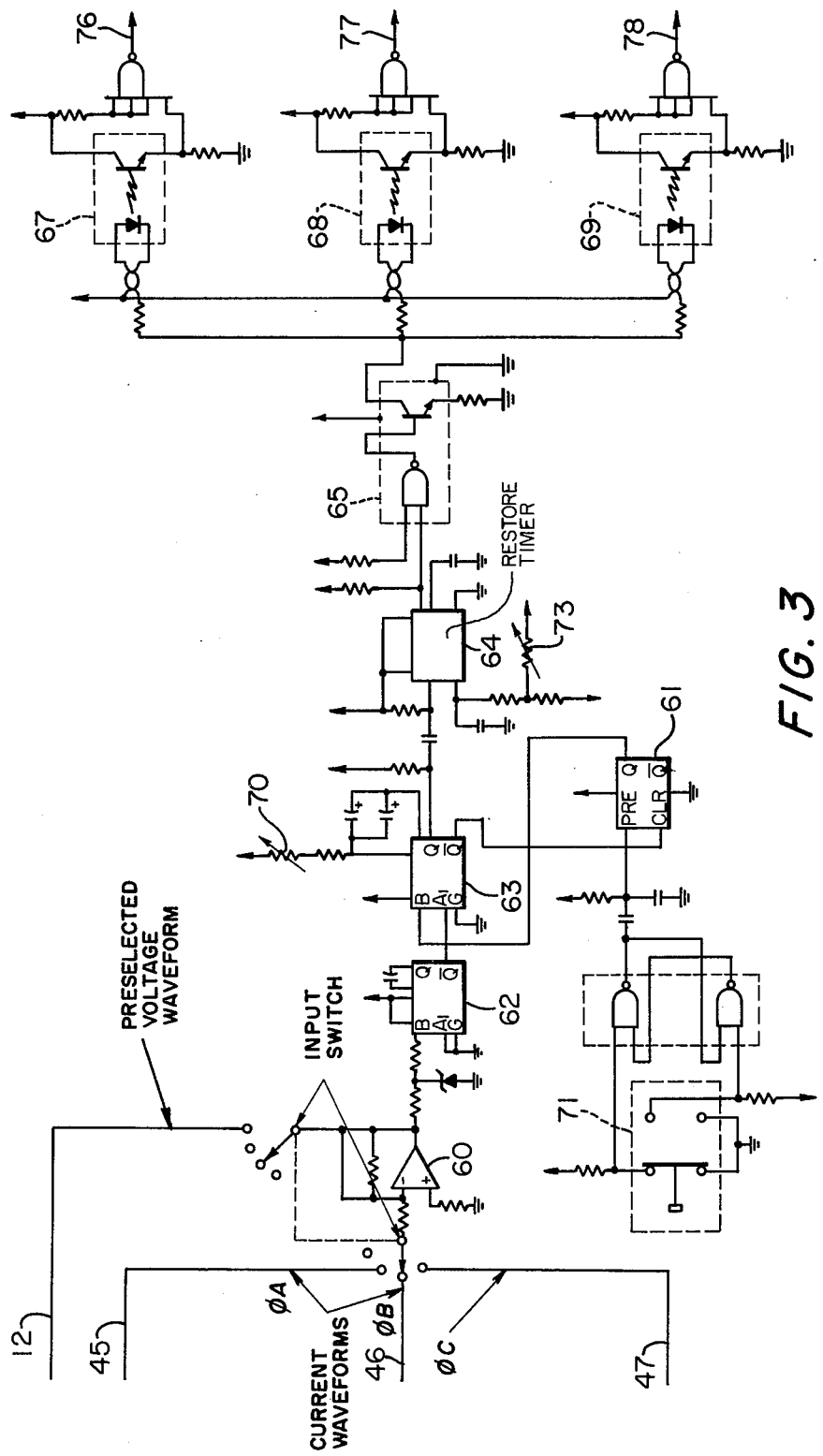

POWER INTERRUPT TEST EQUIPMENT

ORIGIN OF THE INVENTION

The invention described here is made by an employee of the United States Government and may be manufactured and used by or for the Government for Governmental purposes without the payment of any royalties therein or therefor.

BACKGROUND OF THE INVENTION

Electronic equipment is supplied by single and multiphase A.C. currents in both Y and Delta configurations. The performance of this equipment under these various supply currents is critical especially when interrupted and restored.

Inrush currents produced by transformers can destroy components of the electronic equipment and also trip circuit breakers. Values of inrush current are generally determined by the switching of units under test OFF and ON a number of times while observing the inrush current waveform with an oscilloscope. This technique does not assure that the worst-case condition has been obtained; consequently, the test does not produce the sufficiently precise data needed for the power distribution system design. Also, many electronic equipments such as computers and the like are designed to continue normal operation when subjected to momentary power disturbances. This capability is normally provided by furnishing critical units with backup power.

The inventor has discovered that if he could interrupt the voltage at precise phase angles and again restore the voltage at precise known phase angles, he could obtain the maximum inrush current. Moreover, he could study the response of the electronic equipment to power outages and accordingly design protection circuits or backup equipment which would prevent any untoward events such as the destruction of components and the loss of data. Knowing precisely when and how the equipment should respond to various phase angles of interrupts and restorations, the inventor can also test existing equipment in order to evaluate precisely the equipment compliance with specifications.

The inventor, therefore, has discovered a method and designed the equipment to carry out that method which permits him to interrupt power to the electronic equipment at selected sample phase angles spaced over an entire cycle. Furthermore, he can restore power to the electronic equipment at selected sample phase angles over many cycles. The entire operating limits of interruption and restoration needing to be studied and sampled to determine the compliance of preexisting equipment with known or stated specifications is now possible with the availability of the present invention.

SUMMARY OF THE INVENTION

The invention is characterized by the interruption of the supply current to known electrical loads at precise phase angles and restoring the supply current at preselected phase angles to that same equipment in order to study inrush currents and the response of the equipment to interruptions and restorations. Therefore, an object of the present invention is to provide the method and means of interrupting supply current to known load equipment at precise phase angles.

Another object of this present invention is to provide the method and means of restoring supply current to known load equipment at precise phase angles.

Still another object of the present invention is to provide the method and means of interrupting the applied voltage to equipment at known phase angles for single-phase, three-phase Delta or ground Y configurations.

And still another object of the present invention is to provide the method and means of restoring the applied voltage to equipment at known phase angles for single-phase, three-phase Delta and grounded Y configurations.

DESCRIPTION OF THE DRAWINGS

These and other objects, features and advantages of the present invention will become more apparent upon examination of the following description when taken in conjunction with the accompanied drawings, wherein:

FIG. 1 is a voltage detector circuit.

FIG. 2 is a current detector circuit.

FIG. 3 is a control logic circuit.

DESCRIPTION OF THE PREFERRED EMBODIMENTS

Figure 4:
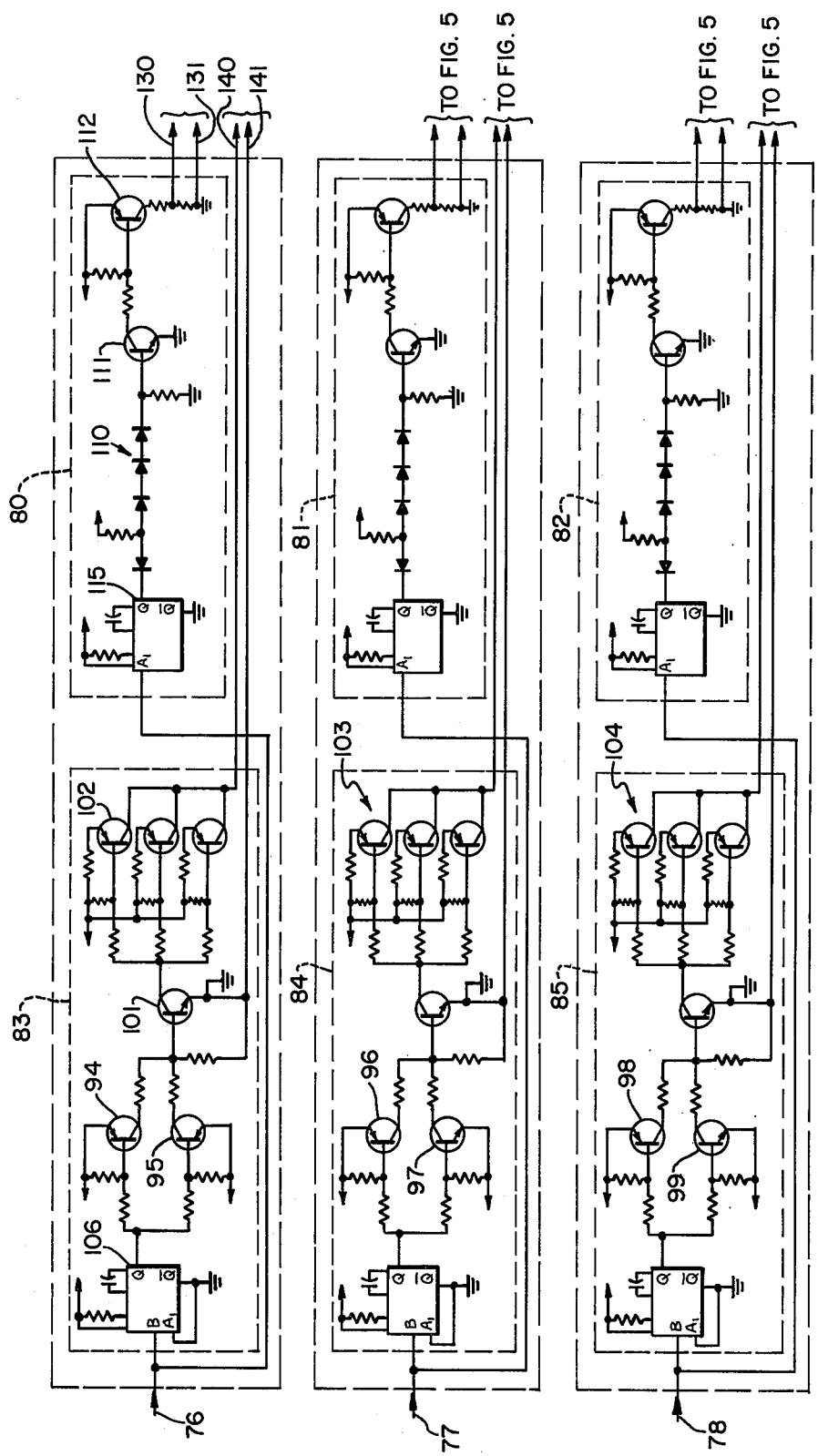
FIG. 4 is a direct current drive circuit.

Referring to FIG. 1 waveform detection is accomplished by a detector circuit. The voltage detector circuit consists of a switch and a step-down transformer. The switch allows selection of any load configuration between phases and between any phase and neutral. The step-down transformer converts the line voltage from 230/115 to 15/7.5 volts. Inputs 13, 14 and 15 and 16 are any three legs of a three phase supply and neutral respectively. Load switch 19 permits connection to a pre-selected load.

Referring to FIG. 2 waveform detection is alternatively accomplished by a current detection circuit. The current detector circuit uses bus bars 21, 22, 23 installed in series with each phase wire between the supply source and load. The dimensions of the bus bar provide a voltage drop of 72.5 microvolts per Amp. Transistors (2N3646) 24, 25, 26, 27, 28 and 29 amplify the voltage drops which are subsequently converted to a current output at a constant transfer ratio of 4 millivolts (mV's) per Amp. Current through the light-emitting diodes (H 21) A1 30, 31, 32, 33, 34 and 35 are coupled within the same units by way of phototransistors (A211A1) 36, 37, 38, 39, 40 and 41 to the detector output to provide isolation from the line voltage. The signal of each phase is respectively then fed to operational amplifiers 42, 43 and 44 which provides gain and converts a differential input to a single-ended output 45, 46, and 47. The gain is adjusted for a range of four decades for measurement of current from 0.3 to 3000 Amps. The output of the differential amplifier is also applied to feedback circuits 51, 52 and 53, which integrates 60-cycle signals over a period of 1 second to maintain the average value at zero. Inrush currents are not affected by the integration circuit.

Referring to FIG. 3, the d.c. control logic circuit consisting of operational amplifier 60, a flip-flop 61, two one-shots 62 and 63, a timer 64, a line driver 65 and three optical couplers with amplifiers 67, 68 and 69. The inputs from the waveform detection circuits are applied to a two-position switch for selection of either waveform. The current detector inputs is first fed to operational amplifier 60 to convert the varying inputs to an output pulse whose leading and trailing edges coincide with the current zero crossovers. The input selected is fed to a "zero-crossing one-shot" 62 which provides 15 microsecond output pulses coincident with the positive transistion crossovers through zero. These pulses are fed to an "interrupt-one-shot" 63 which provides a timed output pulse, which can be adjusted from zero to 16.6 ms by varying ten-turn pot 70. To perform the interruption, the ten-turn pot 70 is set at a mark corresponding to the desired phase angle, and push button 71 is depressed which triggers the flip-flop 61. The output of the flip-flop sets the interrupt one-shot 63 so that the next pulse from the zero-crossing one-shot 62 will trigger the interrupt one-shot 63. The trailing edge of the interrupt one-shot pulse is fed through optical couplers 67, 68 and 69 to the primary drive circuits 83, 84 and 85 of FIG. 4 via output leads 76, 77 and 78 (FIGS. 3 and 4) which switches "OFF" the transistors of the separate phases as will be discussed further.

The power-restore function is accomplished by setting a restore timer 64 via the trailing edge of the output pulse from the interrupt one-shot. The restore timer provides an output pulse which can be adjusted from zero to 200 ms by varying ten-turn pot 73. The trailing edge of the output pulse from the restore timer is fed through optical couplers 67, 68 and 69 to the secondary drive circuits 80, 81 and 82 (FIG. 4) which switches "ON" the SCR's of the separate phases as will be described further.

Figure 5:
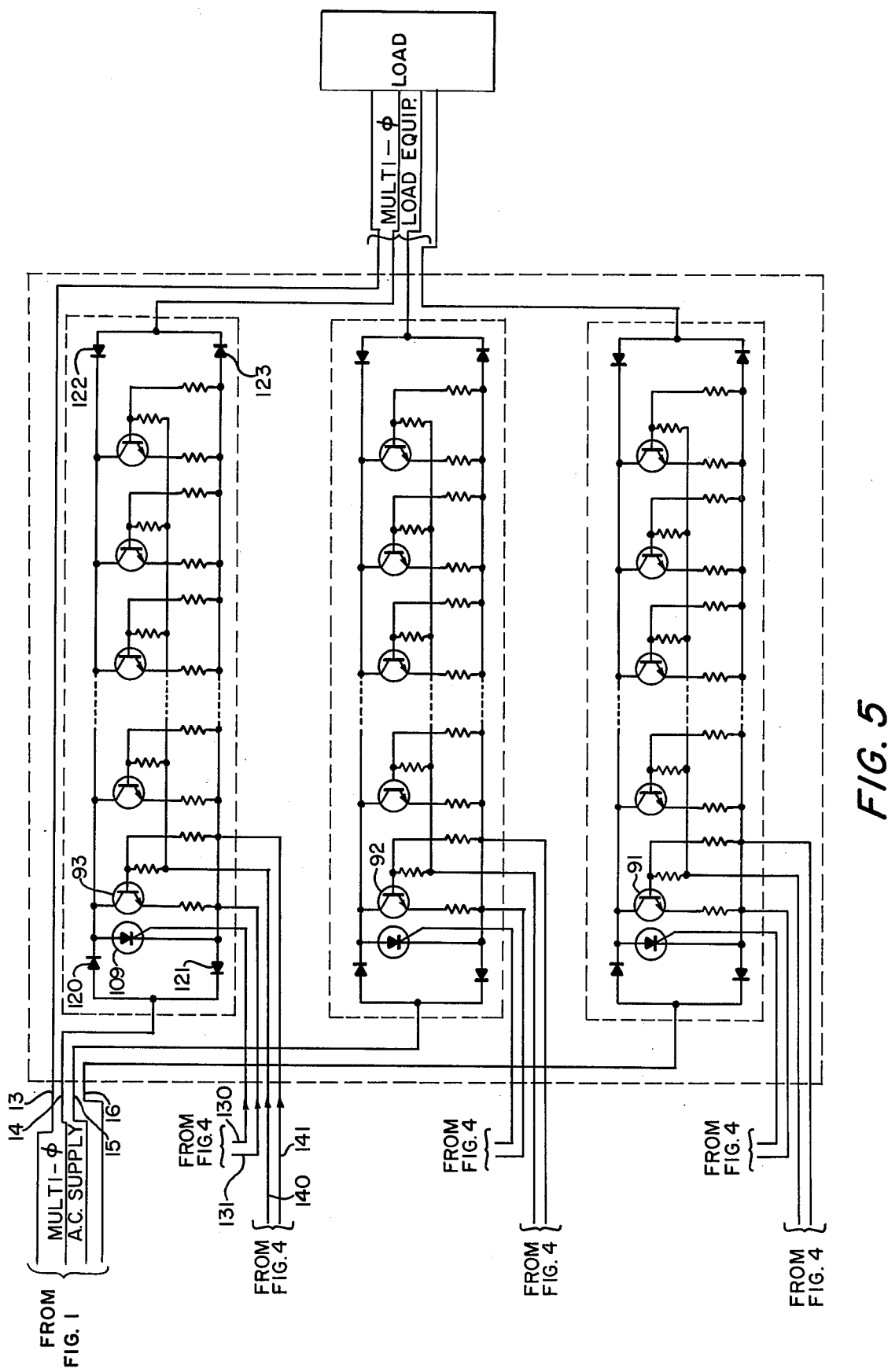
FIG. 5 is an alternating current interrupt restore circuit.

Referring to FIG. 4 the primary d.c. drive circuit function is to provide the drive power to switch "OFF" the 18 a.c. (only 5 shown per phase) circuit transistors to each phase 91, 92, 93 and so forth as shown in FIG. 5 to accomplish a power interruption. The drive circuit consists of a pair per phase of highspeed switch transistors 94, and 95, one NPN 101 and three PNP power amplifiers 102 (and 103, 104 for the other phases). The timing for this circuit is controlled by an SN-74121 500 ms one-shot 106. The separate phase of the three phase circuits are symmetrical and will not be separately discussed.

The secondary d.c. drive circuit provides the drive power to switch the a.c. circuit SCR 109 (FIG. 5) "ON" whenever power restoration is desired. The drive circuit consists of a diode gate 110, a high-speed switch transistor 111 and a power amplifier 112. The timing for this circuit is controlled by an SN-74121 600 ms one-shot 115. Again each separate phase is symmetrical and will not be discussed independently.

The timing sequence of interruption and restoration assures that the transistors are "OFF" during the interval in which power has been restored, and "ringing," due to induction, has ended. For example, if the maximum interruption of 200 ms is desired, the SCR 109 will have been "ON" for 300 ms before the transistors 93 etc. begin to conduct.

Referring now to FIG. 5 the primary a.c. circuit consists of 18 transistors 93, etc. in parallel across a bridge circuit of four silicon rectifier diodes 120, 121, 122 and 123. The particular transistor selected, because of its excellent high-voltage inductive switching characteristics, is a DELCO DTS-804. Eighteen of these transistors in parallel conduct approximately 60 Amps.

The secondary a.c. circuit consists of an SCR 109 across the same diode bridge circuit above i.e. 120, 121, 122 and 123. The peak half-cycle nonrecurrent surge current specification of the diode at maximum-rated load current to 3000 Amps. and, therefore, is the maximum inrush current for this device. The margin of protection expected for the 3000 Amps. ceiling has been substantiated by tests conducted to date.

The primary a.c. circuit is in use during normal load conditions. Alternating current flows to the load through diode 120, the 18 transistors 93, etc., and diode 122 during the positive half cycle and through the load diode 123 and the 18 transistors, and 121 during the negative half cycle. The secondary a.c. circuit is in use for 600 ms upon restoration of power after an interruption. The current flow is the same as previously described, with the exception that the transistors are cut off, and current flow is through the SCR 109.

Although I have described my invention with respect to specific apparatus, I do not wish to be limited thereby. I only wish to be limited by the appended claims.

I claim:
1. A method of determining power interrupted and restoration performance characteristics of electrical equipment comprising the steps of,
detecting the waveforms of the applied power, producing a control signal synchronous with selected phase angles of said waveforms,
and applying said signal to an electronic switch interconnecting said applied power to electrical equipment, whereby the power is interrupted at said selected phase angles.
2. A method of determining the performance characteristics of power interrupted electrical equipment according to claim 1 wherein the detected waveform is a voltage waveform of the applied power.
3. A method of determining the performance characteristics of power interrupted electrical powered equipment according to claim 1 wherein the detected waveform is a current waveform of the applied power.
4. Power interrupt and restoration test equipment comprising,
waveform detection means,
pulse generating means responsive to the detected waveforms,
means for synchronizing the generated pulses with selected phase angles of said detected waveforms,
means for converting said generated pulses into direct current switch voltages, and
a.c. power source switch means responsive to said switch voltages for controlling current flow to interconnected electric equipment.
5. Power interrupt and restoration test equipment according to claim 4, wherein said switch means includes a plurality of parallel interconnecting transistors for interrupting the current flow to said equipment.
6. Power interrupt and restoration test equipment according to claim 5 which further includes interconnecting silicon controlled diode means connected in parallel with said transistors and responsive to said switch voltages for restoring current flow to said equipment.
7. Power interrupt and restoration test equipment according to claim 6 which further includes means for isolating said pulse generating means.
8. Power interrupt and restoration test equipment according to claim 4, wherein said direct current switch voltage means includes a transistor drive means and silicon controlled rectifier means for controlling interruption and restoration of current flow respectively.

* * * * *